(12) United States Patent
Hougham et al.

(10) Patent No.: US 8,959,764 B2
(45) Date of Patent: Feb. 24, 2015

(54) METALLURGICAL CLAMSHELL METHODS FOR MICRO LAND GRID ARRAY FABRICATION

(75) Inventors: Gareth Hougham, Yorktown Heights, NY (US); Gerard McVicker, Yorktown Heights, NY (US); Xiaoxiong Gu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 541 days.

(21) Appl. No.: 12/614,231

(22) Filed: Nov. 6, 2009

(65) Prior Publication Data

US 2011/0111647 A1    May 12, 2011

(51) Int. Cl.
*H01R 43/00*    (2006.01)

(52) U.S. Cl.
USPC ............. 29/884; 29/830; 29/876; 438/618; 439/66; 439/81

(58) Field of Classification Search
USPC ......... 216/13, 41; 257/758; 438/618; 439/66, 439/81; 29/830, 831, 874, 876, 884, 885
See application file for complete search history.

(56) References Cited

U.S. PATENT DOCUMENTS

| | | | |
|---|---|---|---|
| 5,297,967 A | 3/1994 | Baumberger et al. | |
| 5,366,380 A | 11/1994 | Reymond | |
| 6,007,349 A | 12/1999 | Distefano et al. | |
| 6,442,039 B1 | 8/2002 | Schreiber | |
| 6,558,560 B2 * | 5/2003 | Clements et al. | 216/41 |
| 6,672,876 B1 | 1/2004 | Takekoshi | |
| 6,719,569 B2 * | 4/2004 | Ochiai | 439/66 |
| 6,722,893 B2 | 4/2004 | Li et al. | |
| 6,784,378 B2 | 8/2004 | Zhu et al. | |
| 6,916,181 B2 * | 7/2005 | Brown et al. | 439/66 |
| 6,974,332 B2 | 12/2005 | Ma | |
| 7,137,827 B2 | 11/2006 | Hougham et al. | |
| 7,263,771 B2 | 9/2007 | Ochiai | |
| 7,331,796 B2 | 2/2008 | Hougham et al. | |
| 7,383,632 B2 * | 6/2008 | Dittmann | 29/884 |
| 7,449,910 B2 | 11/2008 | Kirby et al. | |
| 7,452,212 B2 | 11/2008 | Hougham et al. | |
| 7,491,069 B1 | 2/2009 | Di Stefano et al. | |
| 7,527,505 B2 | 5/2009 | Murata | |
| 7,832,095 B2 | 11/2010 | Hougham et al. | |
| 8,029,291 B2 | 10/2011 | Park | |

(Continued)

OTHER PUBLICATIONS

International Search Report and Written Opinion dated Nov. 8, 2010.

(Continued)

*Primary Examiner* — Donghai D. Nguyen
(74) *Attorney, Agent, or Firm* — Scully, Scott, Murphy & Presser PC; Daniel P. Morris, Esq.

(57) ABSTRACT

A structure and method for manufacturing the same for manufacturing a contact structure for microelectronics manufacturing including the steps of forming first and second metal sheets to form a plurality of outwardly extending bump each defining a cavity. Symmetrically mating the first and second metal sheets in opposing relation to each other to form upper and lower bumps each defining an enclosure therebetween wherein the mated first and second sheets form a contact structure. Coating the contact structure with an insulating material, and fabricating helix shaped contacts from upper and lower bumps. The helix shaped contacts having first and second portions being in mirror image relationship to each other.

8 Claims, 8 Drawing Sheets

(56) References Cited

U.S. PATENT DOCUMENTS

| | | |
|---|---|---|
| 8,207,604 B2 | 6/2012 | Haba et al. |
| 8,263,879 B2 | 9/2012 | Hougham et al. |
| 2004/0253845 A1 | 12/2004 | Brown et al. |
| 2005/0106902 A1 | 5/2005 | Hougham et al. |
| 2005/0181655 A1 | 8/2005 | Haba et al. |
| 2007/0259539 A1 | 11/2007 | Brown et al. |
| 2007/0298624 A1 | 12/2007 | Hougham et al. |
| 2007/0298626 A1 | 12/2007 | Hougham et al. |

OTHER PUBLICATIONS

US Office Action dated Jun. 14, 2013 issued in U.S. Appl. No. 13/588,585.

* cited by examiner

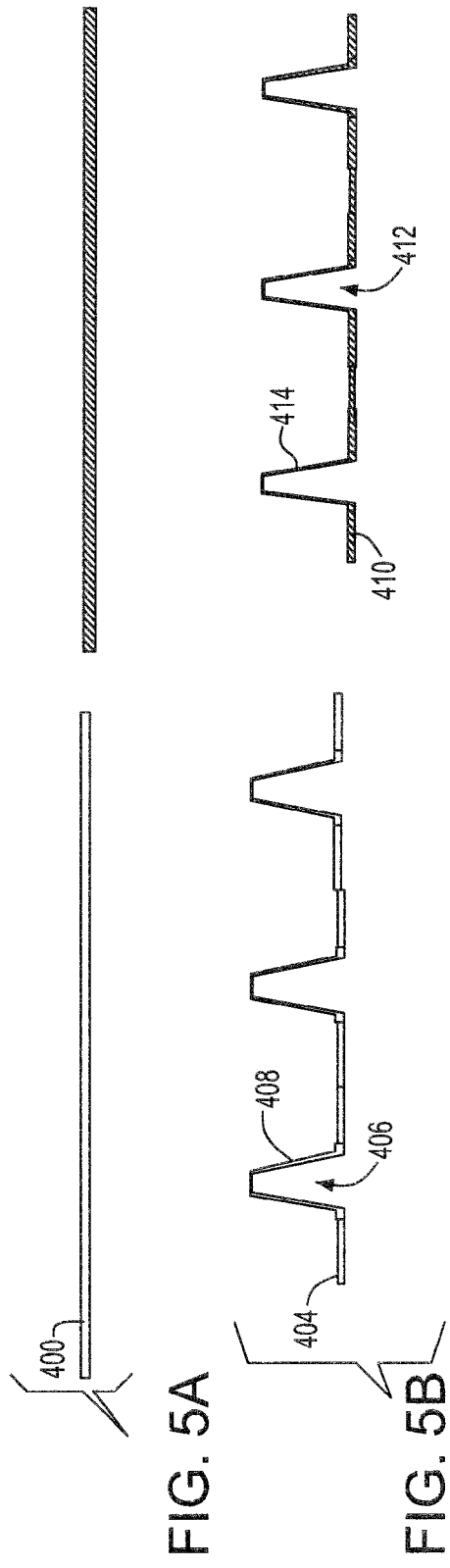

METALLURGICAL CLAMSHELL METHODS FOR MICRO LAND GRID ARRAY FABRICATION

STATEMENT REGARDING FEDERALLY SPONSORED RESEARCH OF DEVELOPMENT

This invention was made with Government support under Contract No.: HR0011-07-9-0002 awarded by (DARPA) Defense Advanced Research Projects Agency. The Government has certain rights in this invention.

CROSS REFERENCE TO RELATED APPLICATIONS

This application is related to the following commonly-owned, co-pending United States Patent Application filed on even date herewith, the entire contents and disclosure of which is expressly incorporated by reference herein in its entirety: U.S. patent application Ser. No. (12/614,224), for "AXIOCENTRIC SCRUBBING LAND GRID ARRAY CONTACTS AND METHODS FOR FABRICATION".

BACKGROUND

The present invention relates generally to the electrical contact structures in the field of microelectronics, and more particularly, relates to electrical contact structures and a method for manufacturing the same for microelectronics and semiconductor manufacturing.

Typical Land Grid Array (LGA) interconnects are 2-dimensional arrays of compliant electrical contacts that are sandwiched between two electrical devices, and pressed together to establish electrical contact in an electrically connected package. The application of force using hardware which surrounds both electrical devices provides the pressing together of the electrical devices. Primarily, varieties of LGAs include: 1. the geometry and constituent materials of the individual contacts; 2. the method of fabrication. The method of fabrication typically includes: 2a. one-shot array formation, i.e., molded or sheet stamped; and 2b. sequential placement of individual contacts to form an array. Example of known LGA fabrication techniques are disclosed in U.S. Pat. Nos. 7,331,796, 7,137,827, and 7,452,212, all of which are commonly assigned with the instant application, and the subject matter of which are hereby incorporated by reference in their entirety.

However, decreasing the size of contact structures negatively affects mating of electrical contacts on each of the electrical devices being pressed together. For example, scaling LGA contact xy dimensions sacrifices z-dimension compliance or true positions (TP) when electrical contacts are pressed together to form an electrically connected package.

It would be desirable to provide an electrical contact structure and method for manufacturing the same which provides smaller scaling of the contact structure with increased contact between electrical contact structures. There is further a need for a method and structure which provides smaller contact size (xy dimension) for LGAs, without sacrificing contact mating (z direction) in an electrical package.

BRIEF SUMMARY

In an aspect of the present invention, a method for manufacturing a contact structure for microelectronics manufacturing, comprises: forming first and second metal sheets to form a plurality of outwardly extending bump each defining a cavity; symmetrically mating the first and second metal sheets in opposing relation to each other to form upper and lower bumps each defining an enclosure therebetween, the mated first and second sheets forming a contact structure; coating the contact structure with an insulating material; and fabricating helix shaped contacts from upper and lower bumps, the helix shaped contacts having first and second portions being in mirror image relationship to each other.

In a related aspect, the bump is frustoconical shaped. The method may further comprise: applying a plurality of conductive metal coatings to the bumps. The fabricating of the helix shaped contact may include using photolithography. The method may further comprise: positioning at least one contact point on each of the contacts between a pair of semiconductor substrates including electrically conductive members; and positioning the at least one contact point on each of the contacts to electrically communicate with respective electrically conductive members to form an electrically conductive package. Also, the method may further comprise: compressing the contacts between the semiconductor substrates such that the contacts twist on the electrically conductive members during the compression. Further, the method may further comprise: positioning a insulting carrier between the first and second metal sheets; and passing a conductive via through the insulating carrier between the upper and lower bumps. The method may further comprise: forming third and fourth metal sheets to form a plurality of outwardly extending bumps each defining a cavity, the third and fourth sheet bumps and corresponding cavities being larger than the bumps of the first and second metal sheets; positioning the third and fourth metal sheets over the first and second metal sheets in mating relation to form the contact structure.

In another aspect of the invention, a method for manufacturing a contact structure for microelectronics manufacturing, comprises: forming first and second metal sheets to form a plurality of outwardly extending bumps each defining a cavity; symmetrically mating the first and second metal sheets in opposing relation to each other to form upper and lower bumps each defining an enclosure therebetween, forming third and fourth metal sheets to form a plurality of outwardly extending bumps each defining a cavity, the third and fourth sheet bumps and corresponding cavities being larger than the bumps of the first and second metal sheets; positioning the third and fourth metal sheets over the first and second metal sheets in mating relation to form a contact structure; coating the contact structure with an insulating material; and fabricating contacts of a predetermined geometric shape from the upper and lower bumps and the third and fourth sheet bumps.

In a related aspect, the contacts are helix shaped contacts, the helix shaped contacts having first and second portions being in mirror image relationship to each other.

In another aspect of the invention, a contact structure for microelectronics, comprises: a contact structure including symmetrically mated first and second metal sheets in opposing relation to each other, the contact structure including third and fourth metal sheets being positioned over the first and second metal sheets in mating relation; upper and lower contact bumps of a predetermined geometric shape extending from the first, second, third and fourth metal sheet combination.

In a related aspect, the contact bumps are helix shaped contacts, and the helix shaped contacts having first and second portions being in mirror image relationship to each other. The first and second portions may be right and left handed helixes, respectively. The upper and lower contact bumps may be symmetrical about a vertical axis bisecting the upper and lower contact bumps. The structure may further include: a pair of insulating substrates including electrically conductive members, and at least one contact point on each of the upper and lower contact bumps are attached and electrically communicating to respective electrically conductive members such that the upper and lower contact bumps between the pair of semiconductor substrates form an electrically conductive package; and the upper and lower contact bumps between the pair of semiconductor substrates being in a compressed state relative to an at rest state, the upper and lower contact bumps being helix shaped, and the helix shaped contact bumps having first and second portions being in mirror image relationship to each other; and a rotational displacement of the upper and lower contact bumps on the electrically conductive members between the compressed state and the at rest state. The method may further comprise: a pair of insulating substrates including electrically conductive members, and at least one contact point on each of the upper and lower contact bumps are attached and electrically communicating to respective electrically conductive members such that the upper and lower contact bumps between the pair of semiconductor substrates form an electrically conductive package; and the upper and lower contact bumps between the pair of semiconductor substrates being in a compressed state relative to an at rest state, and the first, second, third and fourth metal sheets move independently when the electrically conductive package moves from the at rest state to the compressed state. In a related aspect, the first, second, third and fourth metal sheets move radially outward with respect to a vertical axis passing through the upper and lower contact bumps when the electrically conductive package moves from the at rest state to the compressed state.

In another aspect of the invention, a process for manufacturing a contact structure for microelectronics manufacturing, comprises: providing at least one metal sheet; forming the metal sheet to form a plurality of outwardly extending bumps each defining a cavity; coating the molded element with a layer of photoresist; and fabricating contacts of a predetermined geometric shape from the bumps using photolithography and etching. In a related aspect the predetermined geometric shape is a helix shaped contact.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 5A-5D are diagrammatic views of process steps depicting the process for manufacturing a hollow LGA array according to another embodiment of the invention;

DETAILED DESCRIPTION

Figure 1:
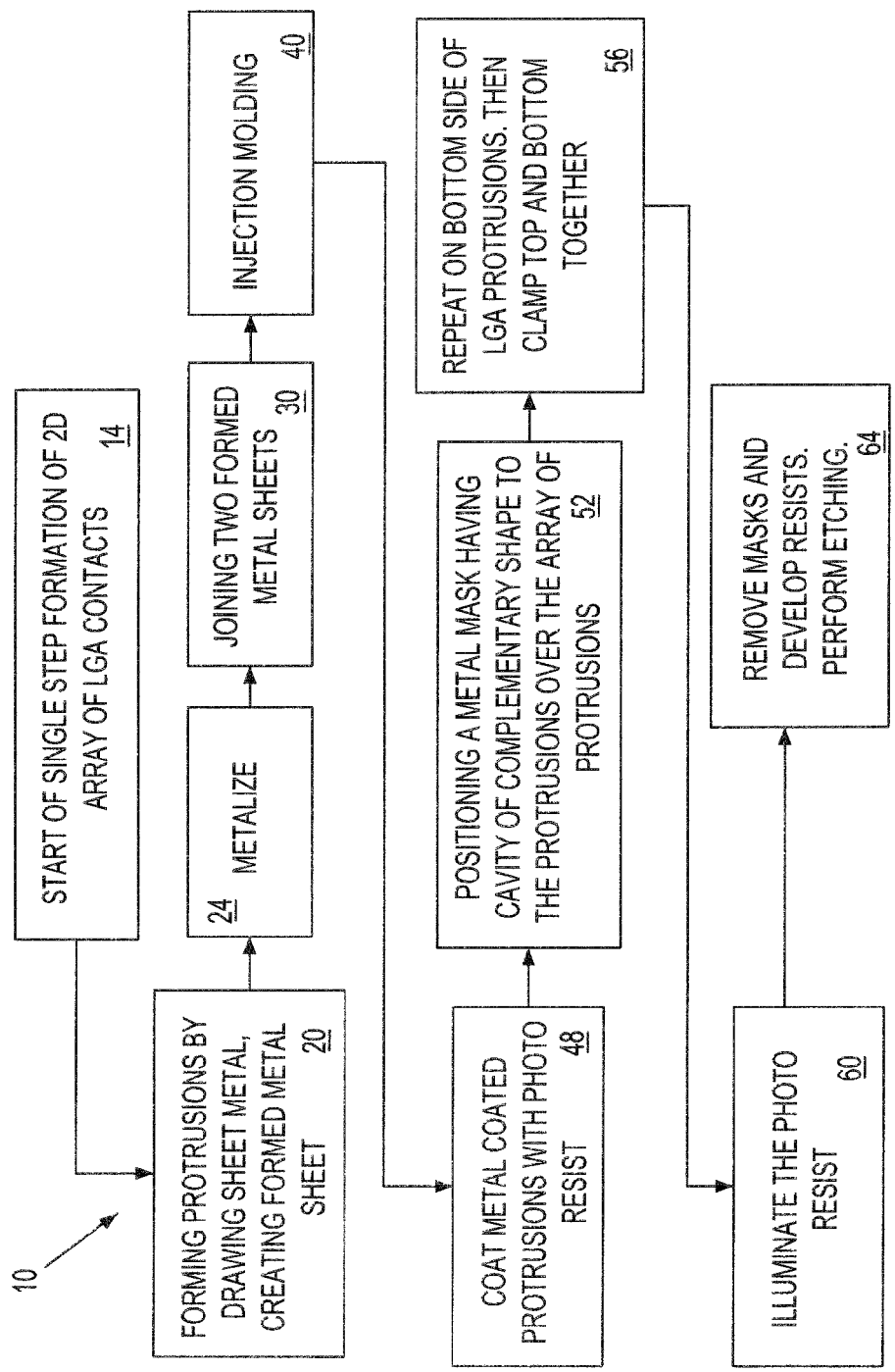
FIG. 1 is flow chart of a method of the invention according to one embodiment of the invention.

Referring to FIG. 1, a method 10 according to one embodiment of the present invention includes the general steps below including step 14 for beginning the formation process of a 2D array of land grid array (LGA) contacts. In step 20, protrusions are made from spring metal by deep drawing sheet metal into arrays of pockets. A thin second metal coating, for example, gold for joining purposes or Be for alloying, may be formed over the array of pockets in metallization step 24.

Figure 2:
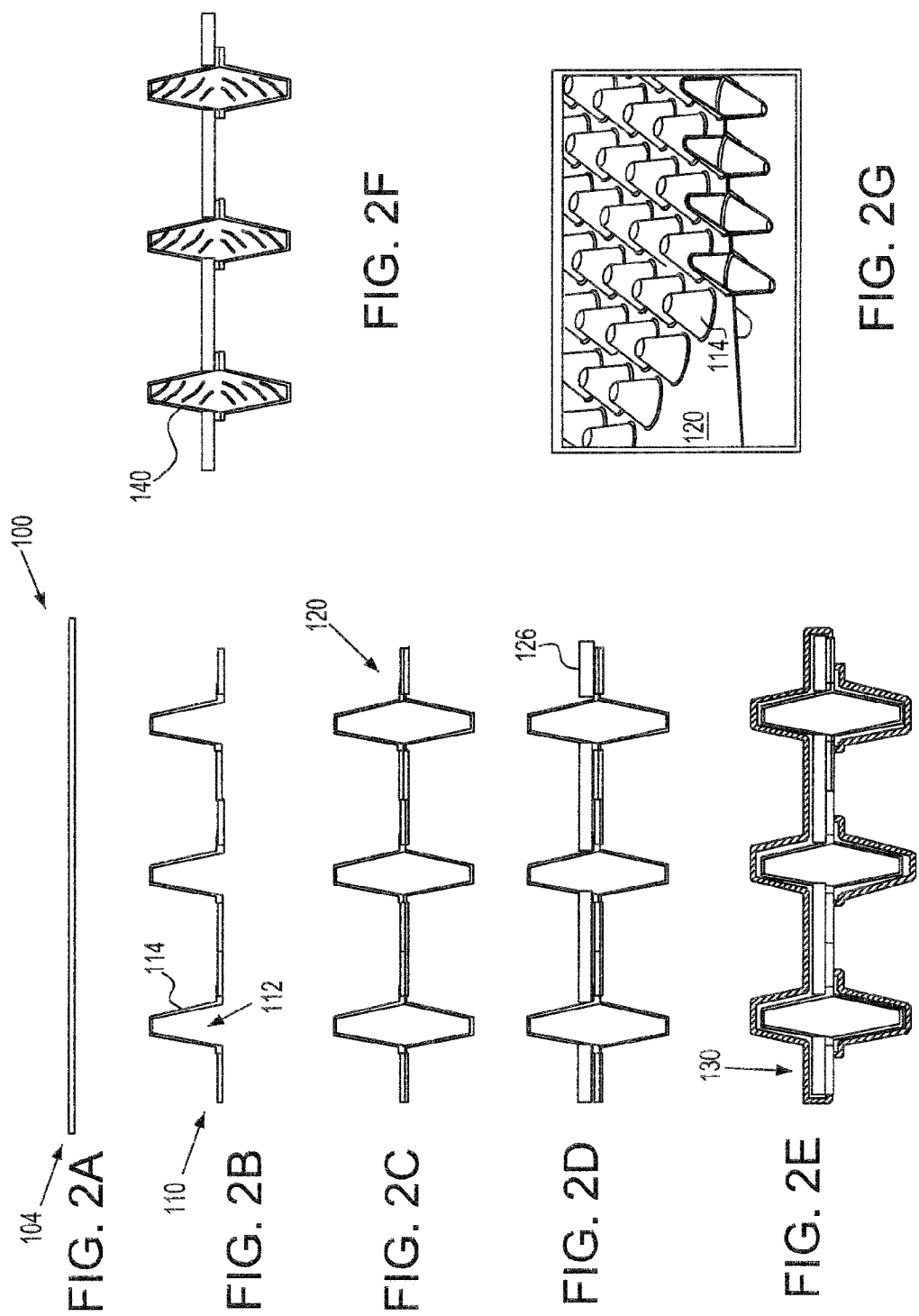
FIGS. 2A-2F are diagrammatic views of process steps depicting the process for manufacturing a hollow LGA array according to an embodiment of the invention.
FIG. 2G is a cross sectional isometric view of the structure shown in FIG. 2C having an array of frustoconical protuberances.

The next step 30 includes joining two metal sheets each having a mating array pattern of pockets. The sheets are joined back to back as shown in FIG. 2C using metallurgical bonding techniques, for example, gold-gold joining, soldering, electron beam welding, copper to copper thermobonding, etc. The joined sheets form a contact structure having metal protrusions opposite one another.

Step 40 includes injection molding a plastic carrier plane onto one side of the joined metal sheets, or alternatively, inserting contacts into a perforated plane and gluing in place.

The contact structure is coated with additional metal layers in some embodiments and photo resist in step 48. In one embodiment of the invention, a conformally coating resist such as electrophoretically deposited resist is used to coat the metal protrusions.

Figure 3:
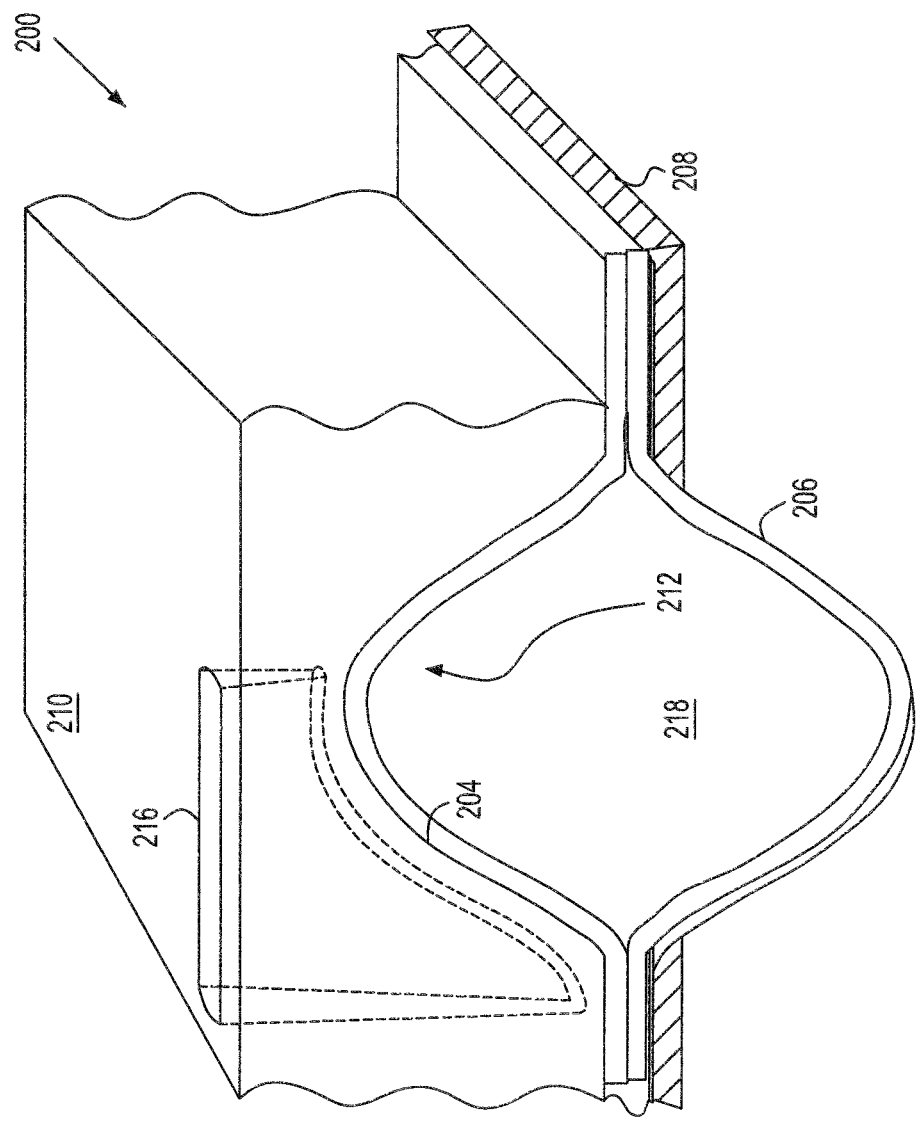
FIG. 3 is an isometric view of an illustrative metal and photo resist coated drawn metal bump with hollow interior sitting within a form fitting cavity of an upper portion of a mask.

A metal mask (shown in FIG. 3) on both sides of the LGA protrusions includes cavities 212 of complementary shape to the protrusions and is placed over an array of protrusions in steps 52 and 56. The cavities are of similar shape to a desired contacts, but slightly larger to account for the photo resist thickness and any tolerance. The masks have patterns in the top formed as slots by wire electric discharge machining (EDM), laser, and chemical etching or other techniques. The patterns transmit light into a pattern onto the photo resist covered contacts or LGA protrusions, without allowing for significant reflections from one contact to another because they are nestled into individual cavities. Referring to FIG. 3, a top portion of the mask is shown, a bottom portion (not shown) is clamped together with the top portion of the metal mask to encase the protrusions.

An ultraviolet light (of specified wavelengths) is shined onto the photo resist in step 60. The photoresist on the contact structure sandwiched between the top and bottom metal masks is sensitive to the light. The clamped together metal masks are rotated and tilted during illumination to optimize uniformity of exposure on every surface of the photo resist covered contact structure.

The masks are removed and the resists are developed in step 64. For example, development of the resists is by etching away unwanted metal to reveal a desired pattern of contacts and to separate contacts from one another.

Referring to FIG. 2A, a process 100 for manufacturing hollow LGA array using a mold includes a flat sheet metal 104. The flat sheet metal 104 is subjected to deep drawing to provide deep wells 112 resulting in bumps or protuberances 114 on the opposite side of the flat sheet metal 104 as shown in FIG. 2B to provide a single contact array structure 110. Two single contact array structures 110 are joined metallurgically back to back as shown in FIG. 2C, with the wells 112 and protuberances 114 opposite one another to form combined contact array structure 120.

A thin layer of insulator 126 is coated on one side of the contact array structure 120 to hold together the two structures 110 as shown in FIG. 2D and to maintain the array positioning after etching to singulate the bumps 140 as illustrated in FIG. 2F. The protuberances 114 are coated with photoresist 130 as shown in FIG. 2E, and developed to expose metal in a desired pattern, for example a helix, and to singulate the contacts from one another. The exposed metal is then etched away to form a pattern, for example, a helix, forming a helix spring contact 140, as shown in FIG. 2F. Referring to FIG. 2G, an array of joined structures 120 is shown in isometric view and cross section.

Referring to FIG. 3, an illustrative mask and hollow bump combination 200 includes a metal and photo resist coated hollow bump having a top portion 204 and a bottom portion 206 the thin insulator on one side is shown in FIG. 3 reference numeral 208. The bump sits within a form fitting cavity 212 of a top portion of a mask solid 210. The mask solid 210 includes a pattern 216 open to the outside. This example shows a slot pattern 216, however, other patterns including multileg helix patterns can be used. A bottom portion of the mask (not shown) typically is clamped together with the top portion 210. The closed mask solid is rotated and illuminated to provide light access through the slot pattern 216, producing the desired image on the bump 204, 206.

Figures 4A, 4B, 4C:
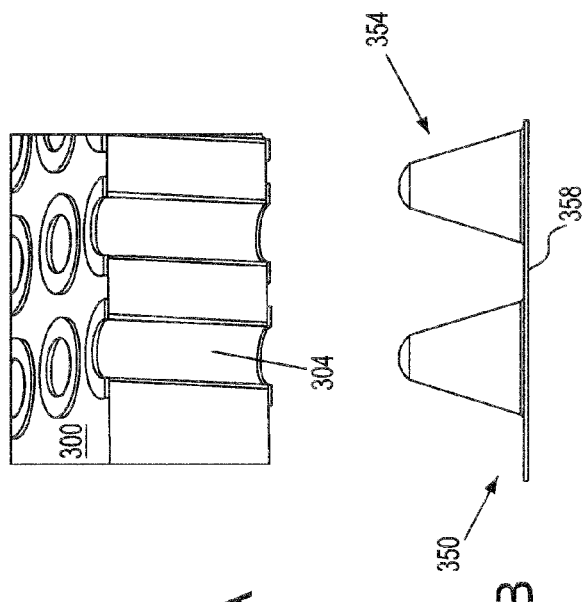
FIG. 4A is an isometric view of an insulating carrier with vias according to another embodiment of the invention.
FIG. 4B is a side elevational view of a drawn metal sheet having frustoconical bumps.
FIG. 4C is an isometric view of the carrier and vias of FIG. 4A mated with the frustoconical bumps of FIG. 4B.

Referring to FIG. 4A, another embodiment of the invention includes a insulating substrate or carrier, for example, a printed circuit board (PCB) 300, between two drawn metal sheets 350, shown in FIG. 4B, having frustoconical bumps 354 in geometric relation similarly to the structure 120 shown in FIG. 2C. The PCB 300 includes conducting vias 304 therethrough. After lithography, the contacts 360 shown in FIG. 4C are electrically communicating using the conducting vias 304, and the metal portion 358 between the frustoconical bumps 354 has been etched away.

Referring to FIGS. 5A-5D, another embodiment according to the invention includes two metal sheets 400 as shown in FIG. 5A. The metal sheet 400 are drawn and patterned similarly to form a first patterned sheet 404 having bumps 408, and a second patterned sheet 410 having bumps 414. A cavity 406 formed by the bump 408 is larger than a cavity 412 formed by bump 414. The bumps and cavities are positioned to mate when the first sheet 404 is positioned over the second sheet 410, as shown in FIG. 5C. The first and second sheets 404, 410, respectively, are mettallurgically joined on the flat surfaces and adjacent in the overlapping bump areas to form nested structure 411. A second combination of first and second sheets 404, 410 is mated with the first combination shown in FIG. 5C to form the combined structure 450 shown in FIG. 5D to form an array of hollow bumps. A pre-coat 454 (e.g., of Au) (not shown) may be formed over the nested structure 411 for joining the two sides back to back as shown in FIG. 5D reference numeral 450. The resulting structure has a thin insulating layer molded to one side for mechanical structure. Etching is performed to impart a pattern and to singulate the bumps from one another. The resulting contact structure 450 after etching a pattern into the bumps, provides a leaf spring action with independent moving layers 404, 410, respectively, as shown in FIG. 5D.

Figure 6:
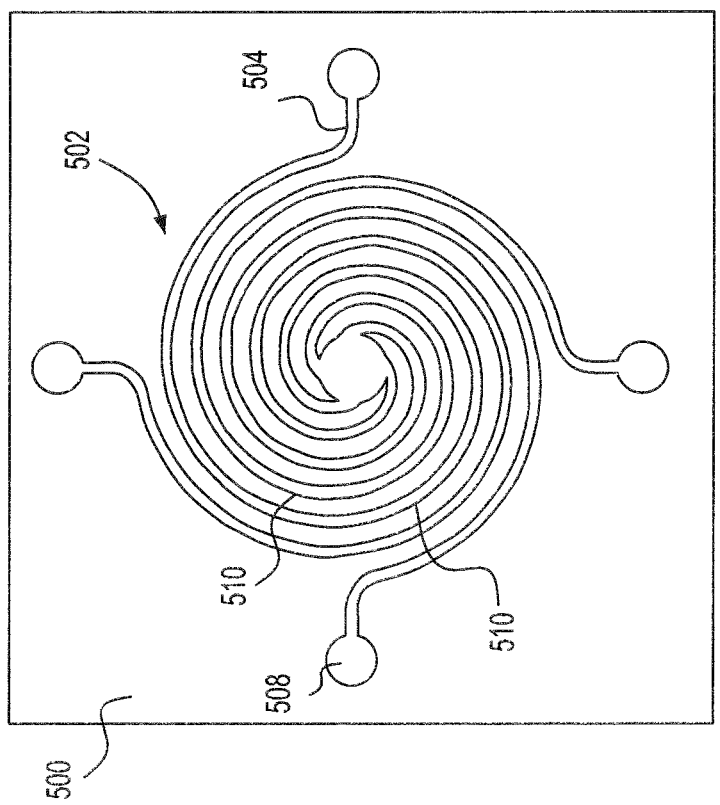
FIG. 6 is a plan view of a mask pattern shaped as a four leg helix.

Referring to FIG. 6, a mask 500, is cut out of metal, and the pattern is cut out from the mask 500 as a four legged 504 helix pattern 502. The helix pattern 502 allows light to pass through the cut away portions 510. The helix pattern 502 includes the four legs 502 having circular pads 508.

Figure 7:
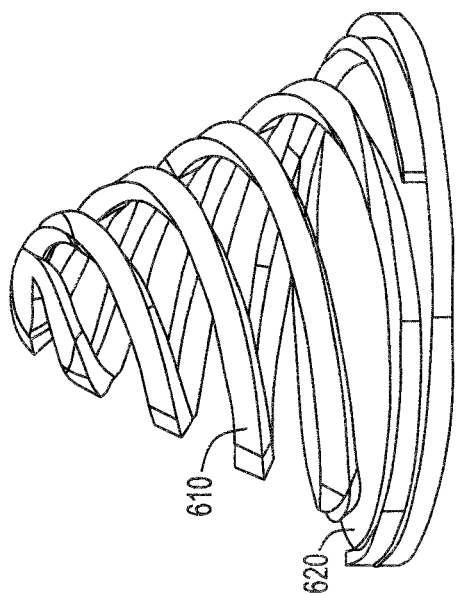
FIG. 7 is an isometric view of a helix spring contact.

Referring to FIG. 7, a helical spring contact 610 is shown after fabrication steps wherein the helically shaped contact has been formed. Also shown is a conducting metal baseplate 620 which may be used in some instances to form mechanical anchoring of the helix legs and to electrically connect top and bottom sides of the contact 610. The baseplate 620 may be used as a conductive element connecting the contact through a via.

Figure 8A:
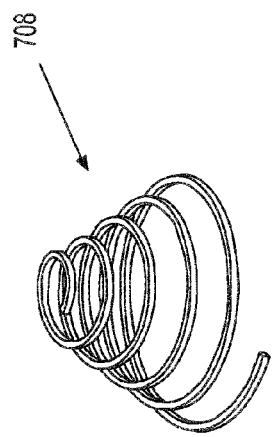
FIGS. 8A-8B are isometric views of helical contacts in reverse directions.
Figure 8B:
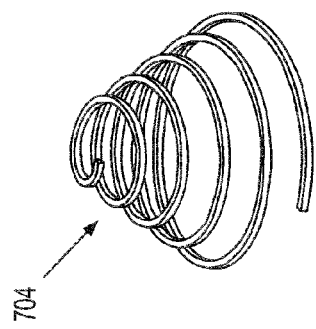
Figure 8C:
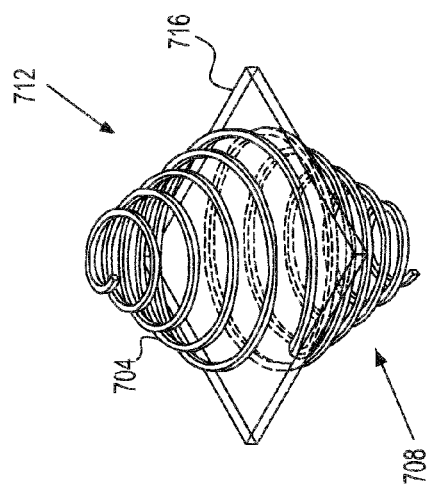
FIG. 8C is a side elevational view of a contact assembly having helical contact in mirror image relation separated by a carrier element.
Figure 8D:
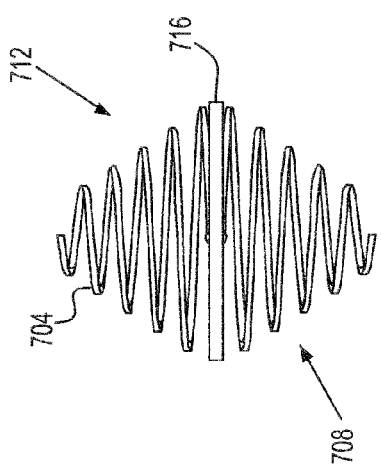
FIG. 8D is an isometric view of the contact assembly in FIG. 8C.

Referring to FIGS. 8A and 8B, two LGA helical spring contacts are shown. A right handed helical contact 704 extending in the clockwise direction. A left handed helical contact 708 extending in the counter clockwise direction is shown in FIG. 8B. Referring to FIGS. 8C and 8D, a contact assembly 712 includes a right handed helical contact 704 in mirror image relation with a left handed helical contact 708 having a carrier element 716 therebetween. The mirror image relation of the right handed and left handed helical contacts 704, 708, respectively, or helix reversal, imparts a signal performance enhancement of the contacts at high frequencies.

Figure 9:
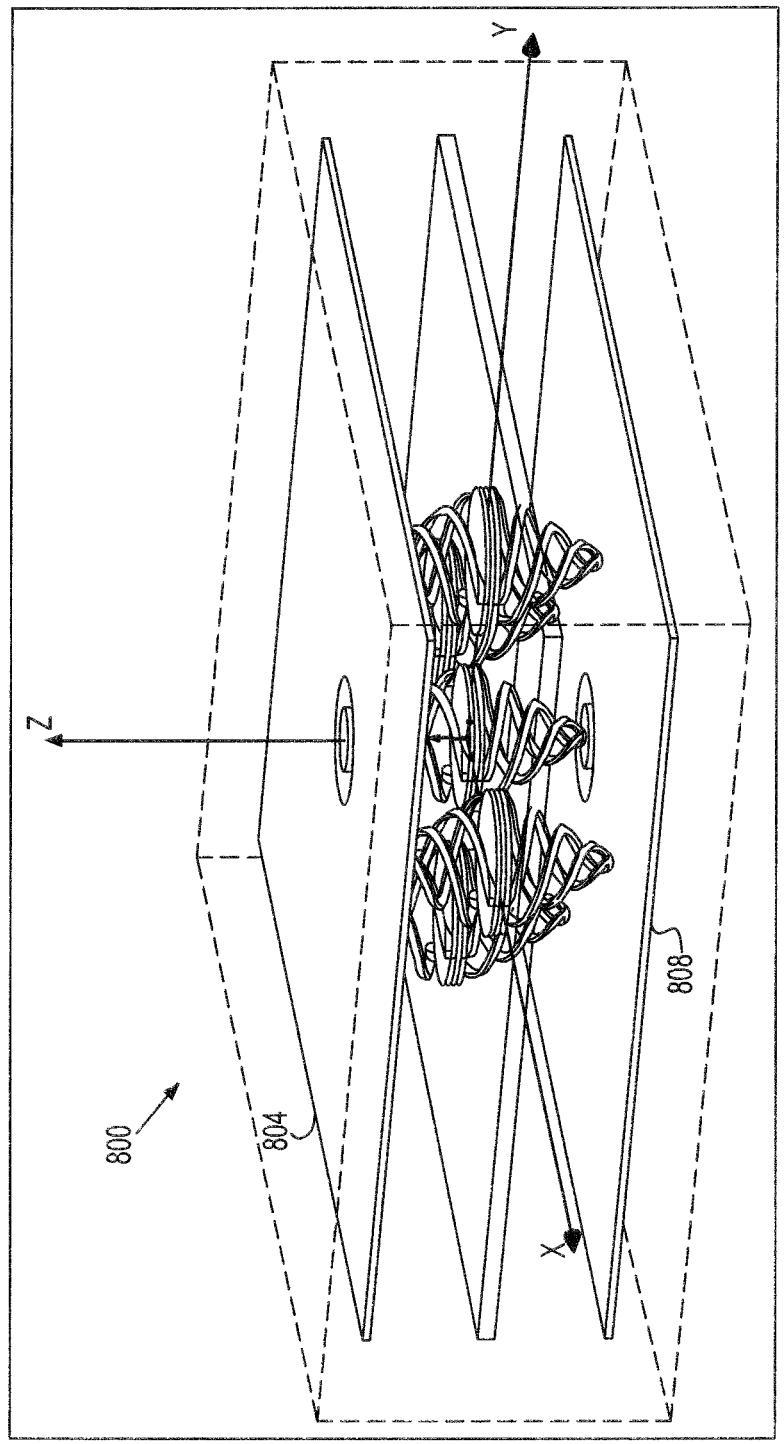
FIG. 9 is an isometric view of a plurality of helical contacts used in high frequency electrical simulation.

Referring to FIG. 9, a plurality of helical contact assemblies 712 (as shown in FIG. 8) including right hand and left hand winding directions as described regarding FIG. 8, are used in a package 800. The package 800 includes the contact assemblies 812 between upper and lower substrates 804, 808, respectively. The package 800 provides helical contact assemblies 812 for high frequency electrical applications.

The present invention achieves a rotational or twisting effect of the helical contacts. This rotation upon compression is desirable to achieve scrubbing through oxide and other thin contaminant layers normally present on electronic contacts. A feature of these helical electrical contact structures is that the direction of helicity reverses as it passes through the central carrier plane, i.e. that the top and bottom helix structures are mirror images with respect to the carrier plane. This preserves the signal integrity of a computer signal at high frequencies by causing significant cancellation of electromagnetic induction.

The advantage of having a rotational scrubbing over typical lateral scrubbing is that as xy dimensions of LGA arrays are decreased, traditional lateral scrubbing increases the chance of the contact moving off the mating contact pad and resulting in an open circuit. Rotational scrubbing of an axiosymmetric contact does not move the contact relative to the position of the mating surface pad, and thus reduces the chances of a contact moving off a mating contact pad.

Additionally, metalization over the initially drawn metal, may include the methods for metalizing including electroplating, electro less plating, physical vapor deposition such as meal evaporation or sputtering, chemical vapor deposition, plasma spray, powder coating, etc. The metalizing could be a single layer or multiple layers of different metals.

In addition, coating with a photo resist, may include electrophoretic or other type of conformal coating method. The extreme z-dimension of LGA contacts complicates photolithography processes in several ways. In order to apply photoresist uniformly, one alternative is to use electrophoretic type photo resists. Electrophoretic resist may be used to provide uniform coverage of photo resist. Other methods of photo resist coating include spraying, spinning and liquid dipping.

3D Masks are used to expose all coated surface with a uniform dose of light using the photo resist coated LGA pre-contacts inserted into form fitting cavities on the underside of a mask. The desired contact pattern is then cut into the top of the mask using a very fine resolution machining technique called wire EDM (electro discharge machining). The LGA precontact protrusions on both sides of a carrier plane are accordingly inserted into masks in a sandwich form. Thus, the part can be illuminated and photo lithographically defined from both sides. 3D masks include a plate of metal where the bottom has machined cavities that are form fitting to the metalized and photo resist coated LGA contact arrays. In practical application the cavities need to be a little bigger in dimension than the coated LGA contacts to account for any fabrication tolerances etc.

The final desired contact pattern is imparted to the mask by cutting or etching light pathways, or slots by wire EDM (wire electrodeposition machining) using very fine cutting wires. Alternatively, slots can be made by laser cutting, chemical etching, plasma etching etc. This slotting is expected to be most practically exercised cutting at right angle to the plane of the mask, i.e., through the z-direction of the mask metal. However, it can be advantageous to cut in a direction at right angles (normal) to the surface of the contact at any given location along the contact. Such normal-to-surface (NTS) slotting allow superior lithographic resolution and superior illumination uniformity.

During photoexposure the entire part and mask sandwich assembly is tilted and rotated to affect as uniform a photoexposure as possible. This is most easily accomplished by moving the assembly with rotation and tilt stages programmed to move through a path optimal for a given contact pattern. Alternatively, the light source can be made to move around the part. Alternatively, the light source can be shaped by holographic and other types of lenses to provide a uniform distribution of light from many directions at once. Once the lithography is completed, the LGA can be removed from the mask sandwich, and lithography steps of developing resist and etching metal into desired pattern are completed.

In an alternative embodiment of the invention, the deep drawing may be initially done with a soft metal like pure copper, and then a second metal such as beryllium is applied to the surfaces of that metal. This multilayer could be heat treated at high temperatures to diffuse one metal into another to form an alloy and quenched or cooled to produce an alloy with the desired microstucture. This sheet, thus formed, would then be used in the process described above regarding FIG. 2A-2F to be joined and lithographically defined into an LGA.

In another embodiment a secondary set of bumps are sacrificial to aid in the alignment before joining two sheets. For the top sheet the secondary bumps may be in the same direction as the main bumps. For the bottom sheet, the secondary bumps may be in the opposite direction as the main bumps. Thus allowing the nesting of secondary bumps of a top sheet into a bottom sheet. These secondary bumps would be placed in areas that would be etched away later in the lithography step.

The present invention thereby, describes deep drawing of high spring constant sheet metals to form array of contours. The metallurgical joining of two structures in a back to back relation with precise alignment. Metalize further with a joining layer if necessary, such as a thin layer of gold. Coating with photo resist, preferably electrophoretic or other type of conformal coating method. Injection mold carrier polymer layer on just one side in between contours. Sandwiching between top and bottom 3D masks of the back to back structures. Photoexposing, and removing LGA from mask to complete lithography.

There are many variations for joining of two metal sheets, bottom to bottom without the intermediate substrate with vias. Such a part could be stabilized by injection molding a plastic sheet on one side only, followed by similar process steps previously described. Any metal to metal bonding technique could be used including electron beam welding, Gold to Gold joining, ultrasonic joining, high pressure joining, laser weld joining, etc. Additionally, there are other ways to form the contoured sheets besides deep drawing. For instance, various constituent pure metals required for an alloy could be deposited in layers upon a sacrificial template that was molded into the exact shape desired in a prior step. The sacrificial template could consist of molded plastic that would burn away cleanly upon heating the entire assembly to high enough temperatures that the metal layers diffuse into one another to form the alloy of interest. An example would be to form a plastic template with an array of bumps of a desired shape, and then to coat copper by electroplating and then beryllium by PVD sputtering. This is heated to 800 deg. C. for one or two hours and then cooled at a rate to optimize the formation of desired grain structure to form CuBe spring metal. Once this contoured sheet is thus formed then it can be metallurgically joined as described earlier. As part of that joining operation other metals or materials may be needed to assist, for instance a thin layer of plated or sputtered gold may be necessary.

The present invention describes how sheet metals can be formed by deep drawing using various standard sheet metal forming techniques (for example, with piston driven tool and die at high temperature) to form a uniform array of bumps. The metal is either a hard spring like metal alloy to begin with or is treated in different ways to result in a hard spring The present invention achieves a rotational or twisting effect of the helical contacts. This rotation upon compression is desirable to achieve scrubbing through oxide and other thin contaminant layers normally present on electronic contacts. A feature of these helical electrical contact structures is that the direction of helicity reverses as it passes through the central carrier plane, i.e. that the top and bottom helix structures are mirror images with respect to the carrier plane. This preserves the signal integrity of a computer signal at high frequencies by causing significant cancellation of electromagnetic induction.

The advantage of having a rotational scrubbing over typical lateral scrubbing is that as xy dimensions of LGA arrays are decreased, traditional lateral scrubbing increases the chance of the contact moving off the mating contact pad and resulting in an open circuit. Rotational scrubbing of an axiosymmetric contact does not move the contact relative to the position of the mating surface pad, and thus reduces the chances of a contact moving off a mating contact pad.

Additionally, metalization over a polymer, may include the methods for metalizing including electroplating, electro less plating, physical vapor deposition such as meal evaporation or sputtering, chemical vapor deposition, plasma spray, powder coating, etc. The metalizing could be a single layer or multiple layers of different metals.

In addition, coating with a photo resist, may include electrophoretic or other type of conformal coating method. The extreme z-dimension of LGA contacts complicates photolithography processes in several ways. In order to photo resist uniformly, one alternative is to use electrophoretic type photo resists. Electrophoretic resist may be used to provide uniform coverage of photo resist. Other methods of photo resist coating include spraying, spinning and liquid dipping.

3D Masks are used to expose all coated surface with a uniform dose of light using the photo resist coated LGA pre-contacts inserted into form fitting cavities on the underside of a mask. The desired contact pattern is then cut into the top of the mask using a very fine resolution machining technique called wire EDM (electro discharge machining). The LGA precontact protrusions on both sides of a carrier plane are accordingly inserted into masks in a sandwich form. Thus, the part can be illuminated and photo lithographically defined from both sides. 3D masks include a plate of metal where the bottom has machined cavities that are form fitting to the metalized and photo resist coated LGA contact arrays. In practical application the cavities need to be a little bigger in dimension than the coated LGA contacts to account for any fabrication tolerances etc.

The final desired contact pattern is imparted to the mask by cutting or etching light pathways, or slots by wire EDM (wire electrodeposition machining) using very fine cutting wires. Alternatively, slots can be made by laser cutting, chemical etching, plasma etching etc. This slotting is expected to be most practically exercised cutting at right angle to the plane of the mask, i.e., through the z-direction of the mask metal. However, it can be advantageous to cut in a direction at right angles (normal) to the surface of the contact at any given location along the contact. Such normal-to-surface (NTS) slotting allow superior lithographic resolution and superior illumination uniformity.

During photoexposure the entire part and mask sandwich assembly is tilted and rotated to affect as uniform a photoexposure as possible. This is most easily accomplished by moving the assembly with rotation and tilt stages programmed to move through a path optimal for a given contact pattern. Alternatively, the light source can be made to move around the part. Alternatively, the light source can be shaped by holographic and other types of lenses to provide a uniform distribution of light from many directions at once. Once the lithography is completed, the LGA can be removed from the mask sandwich, and lithography steps of developing resist and etching metal into desired pattern are completed.

In an alternative embodiment, a process includes depositing constituent metal layers over the sacrificial polymer protrusions. For instance, to make a thin film copper beryllium contact, first electroplating 12.50 µm copper, then sputter (or by alternative methods) deposit 2.5 µm of Beryllium, followed by deposition of a second layer of 12.5 µm copper. This metal deposition would be followed by coating with photo resist (e.g., electrophoretic photo resist) and would be sandwiched into 3D egg carton like mask and exposed to light (e.g., Ultraviolet). The part would then be removed from the mask, the photo resist developed to remove protection from any metal desired to be removed. The unprotected areas of the metal would then be etched away. The part is then heated in an oven at sufficiently high temperatures and long enough period of time for the metals to diffuse together to form the alloy of interest after cooling at appropriate rates to obtain the temper of interest by controlled quenching. In this example, Cu and Be would need temperatures of 850 degrees C. for about an hour to diffuse (see Table 1 below). In the heating process the sacrificial polymer protrusions would have burned away and the remaining photo resist will have burned away (or could be removed chemically after the etching).

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for manufacturing a contact structure for microelectronics manufacturing, comprising:
   forming first and second metal sheets to form a plurality of outwardly extending bumps each defining a cavity;
   symmetrically mating the first and second metal sheets in opposing relation to each other to form upper and lower bumps each defining an enclosure therebetween, the mated first and second sheets forming a contact structure;
   coating the contact structure with an insulating material on at least one of the first and second metal sheets after the first and second metal sheets have been mated together; and
   fabricating helix shaped contacts from the upper and lower bumps, the helix shaped contacts having first and second portions being in opposing mirror image relationship to each other.

2. The method of claim 1, wherein the bumps are frusto-conically shaped.

3. The method of claim 1, further comprising:
   applying a plurality of conductive metal coatings to the bumps.

4. The method of claim 1, wherein fabricating the helix shaped contact includes using photolithography.

5. The method of claim 1, further comprising:
   positioning at least one contact point on each of the contacts between a pair of semiconductor substrates including electrically conductive members; and
   positioning the at least one contact point on each of the contacts to electrically communicate with respective electrically conductive members to form an electrically conductive package.

6. The method of claim 1, further comprising:
   compressing the contacts between the semiconductor substrates such that the contacts twist on the electrically conductive members during the compression.

7. The method of claim 1, further comprising:
   forming third and fourth metal sheets to form a plurality of outwardly extending bumps each defining a cavity, the third and fourth sheet bumps and corresponding cavities being larger than the bumps of the first and second metal sheets;
   positioning the third and fourth metal sheets over the first and second metal sheets in mating relation to form the contact structure.

8. A method for manufacturing a contact structure for microelectronics manufacturing, comprising:
   forming first and second metal sheets to form a plurality of outwardly extending bumps each defining a cavity;
   symmetrically mating the first and second metal sheets in opposing relation to each other to form upper and lower bumps each defining an enclosure therebetween,
   forming third and fourth metal sheets to form a plurality of outwardly extending bumps each defining a cavity, the third and fourth sheet bumps and corresponding cavities being larger than the bumps of the first and second metal sheets;

positioning the third and fourth metal sheets over the first and second metal sheets in mating relation to form a contact structure;

coating on at least one of the first, second, third and fourth metal sheets after the contact structure is formed; and fabricating contacts of a predetermined geometric shape from the upper and lower bumps and the third and fourth sheet bumps, wherein the contacts are helix shaped contacts, the helix shaped contacts having first and second portions being in mirror image relationship to each other.

* * * * *